(12) United States Patent
McCallister et al.

(10) Patent No.: US 8,934,573 B2
(45) Date of Patent: *Jan. 13, 2015

(54) DISTORTION-COMPENSATED RF TRANSMITTER AND METHOD THEREFOR

(71) Applicant: CrestCom, Inc., Scottsdale, AZ (US)

(72) Inventors: Ronald Duane McCallister, Scottsdale, AZ (US); Eric M. Brombaugh, Mesa, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/070,946

(22) Filed: Nov. 4, 2013

(65) Prior Publication Data

US 2014/0056343 A1    Feb. 27, 2014

Related U.S. Application Data

(63) Continuation of application No. 11/870,021, filed on Oct. 10, 2007, now Pat. No. 8,605,814.

(51) Int. Cl.
| | |
|---|---|
| H04L 25/49 | (2006.01) |
| H04L 25/03 | (2006.01) |
| H03F 1/02 | (2006.01) |
| H03F 1/32 | (2006.01) |

(Continued)

(52) U.S. Cl.
CPC ........ *H04L 25/03343* (2013.01); *H03F 1/0261* (2013.01); *H03F 1/3205* (2013.01); *H03F 1/56* (2013.01); *H03F 3/245* (2013.01); *H03F 3/60* (2013.01); *H03F 2200/15* (2013.01); *H03F 2200/18* (2013.01); *H03F 2200/423* (2013.01); *H03F 2200/438* (2013.01); *H03F 2200/451* (2013.01); *H04B 2001/0433* (2013.01)

USPC ............ 375/296; 375/297; 375/316; 375/318

(58) Field of Classification Search
USPC ............... 375/219, 220, 222, 240.26–240.27, 375/295, 296, 297, 316, 318, 317, 319

See application file for complete search history.

(56) References Cited

U.S. PATENT DOCUMENTS

| | | |
|---|---|---|
| 4,591,803 A | 5/1986 | Saleh |
| 5,270,667 A | 12/1993 | Upton |

(Continued)

OTHER PUBLICATIONS

Cavers, "A Linearizing Predistorter With Fast Adaptation", (40th IEEE Vehicular Technology Conference), May 1990, pp. 41-47, Canada.

(Continued)

*Primary Examiner* — Sam K Ahn
*Assistant Examiner* — Linda Wong
(74) *Attorney, Agent, or Firm* — Schmeiser, Olsen & Watts LLP; Lowell W. Gresham (57) ABSTRACT

An RF transmitter (10) includes an RF amplifier (28) that generates an amplified RF signal (36) including a linear RF signal (92) and a spurious baseband signal (94). The spurious baseband signal (94) interacts with bias feed networks (56, 66) to cause the RF amplifier (28) to generate an unwanted RF distortion at or near the allocated RF bandwidth. A baseband compensation signal (98) is generated and equalized in an adaptive equalizer (102) then fed to the RF amplifier (28). A feedback signal (46) is obtained from the RF amplifier (28) and used to drive the adaptive equalizer (102). A feedback loop causes the adaptive equalizer to adjust a baseband signal (24, 32) supplied to the RF amplifier (28) so that the RF distortion is minimized.

18 Claims, 4 Drawing Sheets

(51) Int. Cl.
*H03F 1/56* (2006.01)
*H03F 3/24* (2006.01)
*H03F 3/60* (2006.01)
*H04B 1/04* (2006.01)

(56) References Cited

U.S. PATENT DOCUMENTS

| | | | |
|---|---|---|---|
| 5,272,450 | A | 12/1993 | Wisherd |
| 6,081,160 | A | 6/2000 | Custer et al. |
| 6,141,390 | A | 10/2000 | Cova |
| 6,639,465 | B2 * | 10/2003 | Samelis et al. ............. 330/129 |
| 6,792,252 | B2 | 9/2004 | Kimball et al. |
| 7,023,267 | B2 | 4/2006 | Lee et al. |
| 7,106,134 | B2 | 9/2006 | Khanifar et al. |
| 7,773,692 | B2 * | 8/2010 | Copeland et al. ............ 375/297 |
| 7,792,214 | B2 | 9/2010 | Matsuura et al. |
| 8,605,814 | B2 * | 12/2013 | McCallister et al. ........ 375/296 |
| 2001/0022532 | A1 | 9/2001 | Dolman |
| 2005/0163208 | A1 | 7/2005 | McCallister |
| 2006/0217083 | A1 | 9/2006 | Braithwaite |
| 2008/0211576 | A1 * | 9/2008 | Moffatt et al. ............... 330/149 |

OTHER PUBLICATIONS

Ding et al., "A Memory Polynomial Predistorter Implemented Using TMS320C67XX", (Proceedings of Texas Instruments Developer Conference), Feb. 2004, pp. 1-7, Texas, USA.

Liu et al., "Deembedding Static Nonlinearities and Accurately Identifying and Modeling Memory Effects in Wide-Band RF Transmitters", (IEEE Transactions on Microwave Theory and Techniques), Nov. 2005, pp. 3578-3587, vol. 53, No. 11, Canada.

Morgan et al., "A Generalized Memory Polynomial Model for Digital Predistortion of RF Power Amplifiers", (IEEE Transactions on Signal Processing), Oct. 2006, pp. 3852-3860, vol. 54, No. 10, Canada.

Zhu et al., "An Overview of Volterra Series Based Behavioral Modeling of RF/Microwave Power Amplifiers", (RF & Microwave Research Group University College Dublin © 2006 IEEE), pp. 1-5, Ireland.

Brinkhoff, "Bandwidth-Dependent Intermodulation Distortion in FET Amplifiers", Thesis, Submitted to Macquarie University, Dec. 20, 2004, Sydney, Australia.

Wang, "CMOS Power Amplifiers for Wireless Communications", 2003, University of California, San Diego.

A. Carusone, et al., "Analog Filter Adaptation Using a Dithered Linear Search Algorithm", IEEE Int. Symp. Circuits and Syst., May 2002.

J. Vuolevi, et al., "Distortion in RF Power Amplifiers", Chapter 7, 2003, Artech House, Inc., Norwood, Massachusetts.

T. Rahkonen, et al., "Polynomial 2.1 GHz RF predistorter IC with envelope injection output", Norchip conference Nov. 21-22, 2005, Oulu, Finland, pp. 230-233.

O. Tornblad, et al., "Modeling and Measurements of Electrical and Thermal Memory Effects for RF power LDMOS", pp. 2015-2018, 2007 IEEE.

A. Saleh, et al., "Improving the Power-Added Efficiency of FET Amplifiers Operating with Varying-Envelope Signals", IEEE Transactions on Microwave Theory and Techniques, vol. 31, No, 1, Jan. 1983.

Y. Yang, et al., "A New Empirical Large-Signal Model of Si LDMOSFETs for High-Power Amplifier Design", IEEE Transactions on Microwave Theory and Techniques, vol. 49, No. 9, Sep. 2001.

J. Stevenson Kenney, et al., "Identification of RF Power Amplifier Memory Effect Origins using Third-Order Intermodulation Distortion Amplitude and Phase Asymmetry", School of Electrical and Computer Engineering, Georgia Institute of Technology, Atlanta, Georgia, 2006 IEEE.

J. Cha, et al., "Memory Effect Minimization and Wide Instantaneous Bandwidth Operation of a Base Station Power Amplifier", Microwave Journal, vol. 5, No. 1, Jan. 2007.

F. Wang, et al., "Design of Wide-Bandwidth Envelope-Tracking Power Amplifiers for OFDM Applications", IEEE Transactions on Microwave Theory and Techniques, vol. 53, No. 4, Apr. 2005.

B. Sahu, et al., "A High-Efficiency Linear RF Power Amplifier With a Power-Tracking Dynamically Adaptive Buck-Boost Supply", IEEE Transactions on Microwave Theory and Techniques, vol. 52, No. 1, Jan. 2004.

International Search Report and Written Opinion regarding PCT/US2008/078580, dated Dec. 5, 2008.

Leung, et al., Analysis of Envelope Signal Injection for Improvement of RF Amplifier Intermodulation Distortion, IEEE Journal of Solid-State Circuits, Sep. 2005, p. 1888-1894, vol. 40 No. 9.

Hu, et al., A New Method of Third-Order Intermodulation Reduction in Nonlinear Microwave Systems, IEEE Transactions on Microwave Theory and Techniques, Feb. 1986, p. 245-250, vol. MTT-34, No. 2.

* cited by examiner

DISTORTION-COMPENSATED RF TRANSMITTER AND METHOD THEREFOR

TECHNICAL FIELD OF THE INVENTION

The present invention relates generally to the field of radio-frequency (RF) transmitters. More specifically, the present invention relates to circuits and techniques of RF transmitters that linearize, compensate, and otherwise improve upon the less than perfectly linear response characteristics of RF amplifiers.

BACKGROUND OF THE INVENTION

Linearity refers to the ability of an RF amplifier portion of an RF transmitter to amplify without distortion. Bias feed networks for the RF amplifier provide one source of RF amplifier distortion, and this type of distortion becomes increasingly significant as the bandwidth over which the RF amplifier is asked to provide a linear response increases.

A bias feed network provides what is typically thought of as a direct-current (DC) voltage to a terminal of an amplifying device, such as a transistor, field-effect transistor (FET), electron tube, or the like to establish a desired operating point. At an input or control terminal of the RF amplifier, the bias voltage is often combined with the RF communication signal to be amplified by the RF amplifier. At an output or conduction terminal of the RF amplifier, the amplified RF signal is also combined with a bias voltage.

Unfortunately, "linear" real world RF amplifiers fail to provide a perfectly linear response characteristic to the signals they amplify. In other words, in addition to the signal being amplified, they produce distortion. The totality of all characteristics of the distortion produced at the output of an RF amplifier is a complex subject. Some of the distortion is relatively harmless because it is characterized by energy far outside the bandwidth of the amplified RF communication signal, it is at a very low level, and can be adequately attenuated through matching networks and other devices prior to being radiated from an antenna.

But one particular distortion product interacts with bias feed networks to worsen another particularly vexing distortion product. In particular, RF amplifier energy that appears near DC, at baseband frequencies, is troublesome. This baseband energy corrupts bias signals, which in turn interacts with the RF communication signal being amplified to produce intermodulation distortion products (IMDs). These IMDs appear at, and to some extent outside of, the bandwidth allocated to the RF transmitter. RF transmitters are asked to comply with increasingly strict regulations called spectral masks that specify how little energy may be transmitted outside of the RF transmitter's allocated bandwidth. Consequently, unless such IMDs are reduced, the RF transmitter will likely fail to comply with regulatory spectral mask requirements and produce in-band distortion as well.

Desirably, a bias feed network presents an impedance to ground at the RF amplifier, whether at an input or output of the amplifier, that varies with frequency. At low, baseband frequencies the impedance is desirably low so that the amplifier will demonstrate reasonable linearity. This low impedance helps to attenuate baseband distortion products as well. But at RF the impedance is desirably high so that the RF signal being amplified will not be unnecessarily attenuated.

Conventional practices call for the use of bias feed networks made from analog and often times passive RF components. One common practice forms bias feed networks from transmission lines, one-quarter of an RF wavelength long, terminated at a distal end from the RF amplifier by one or more capacitors. But as bandwidths increase and spectral emission regulations become increasingly strict, it becomes increasingly difficult to design a bias feed network that has both effectively low impedance over the entirety of the baseband bandwidth and at the same time effectively high impedance at RF. As a consequence, some baseband distortion reacts with the ineffectively low impedance of bias feed networks, causing IMDs which interfere with ability of the RF amplifier to comply with a strict regulatory spectral mask.

SUMMARY OF THE INVENTION

It is an advantage of at least one embodiment of the present invention that an improved distortion-compensated RF amplifier and method therefor are provided.

Another advantage of at least one embodiment of the present invention is that RF distortion is compensated at an RF amplifier.

Another advantage of at least one embodiment of the present invention is that equalization applied to a baseband compensation signal fed to an RF amplifier adapts to minimize RF distortion in an amplified RF signal.

Another advantage of at least one embodiment of the present invention is that a feedback signal is developed from the RF amplifier and used to control a baseband compensation signal fed to an RF amplifier to minimize a spurious baseband signal generated by the RF amplifier.

These and other advantages are realized in one form by a distortion-compensated radio-frequency (RF) transmitter which includes an RF amplifier. The RF amplifier generates an amplified RF signal which includes a spurious baseband signal. The amplified RF signal is generated in response to an RF communication signal supplied to the RF amplifier. The RF transmitter also includes a baseband signal processor configured to generate a baseband compensation signal corresponding to the RF communication signal and to apply equalization to the baseband compensation signal to produce an equalized baseband compensation signal. The baseband signal processor has an output coupled to the RF amplifier. A feedback processor has an input coupled to the RF amplifier and an output coupled to the baseband signal processor. The baseband signal processor is configured so that the equalization applied to the baseband compensation signal adapts to minimize distortion in the amplified RF signal caused by the spurious baseband signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
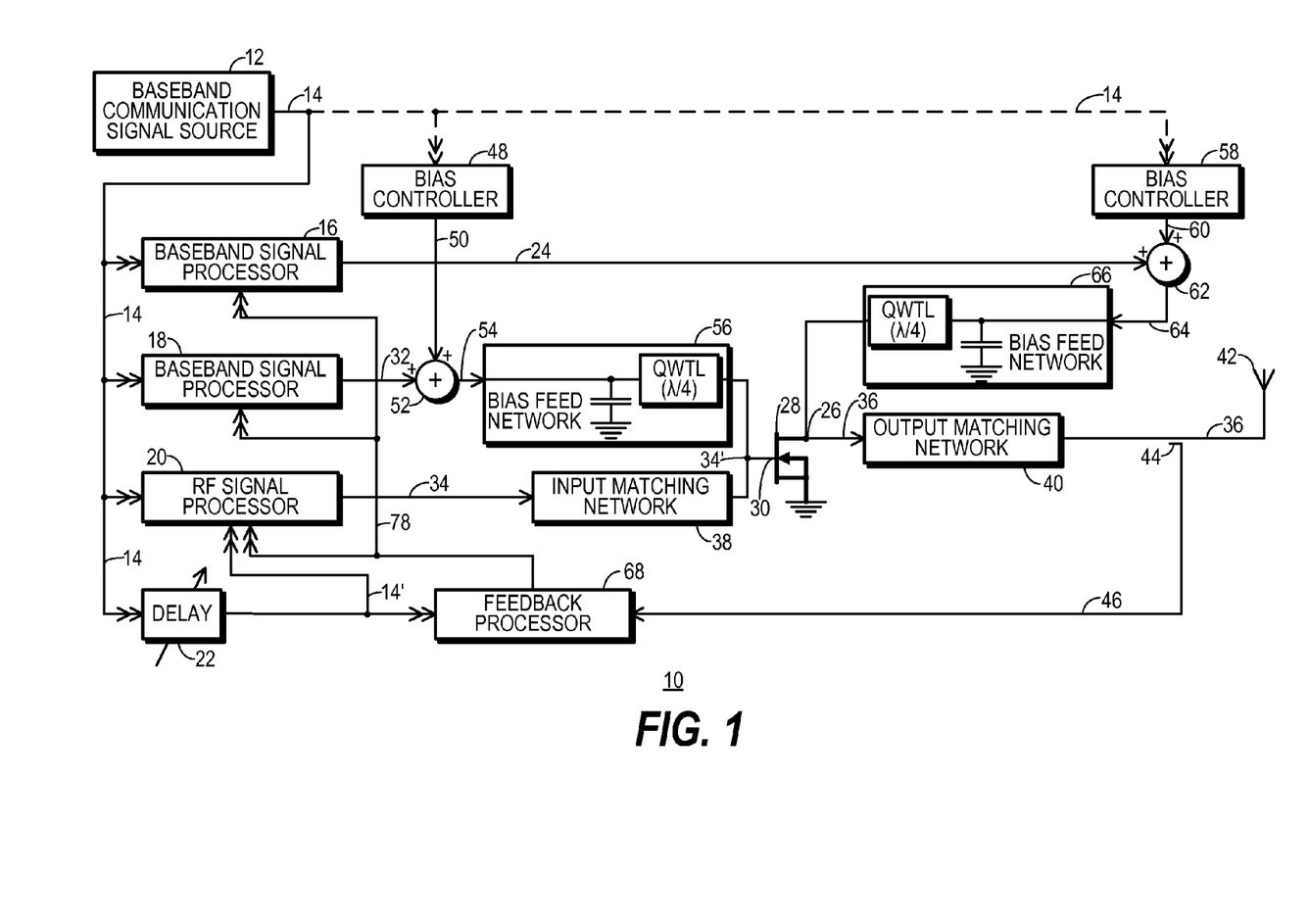
FIG. 1 shows a block diagram of an RF transmitter configured in accordance with the teaching of one embodiment of the present invention.

FIG. 1 shows a block diagram of a radio-frequency (RF) transmitter 10 configured in accordance with the teaching of one embodiment of the present invention. RF transmitter 10 includes a baseband communication signal source 12. Baseband communication signal source 12 provides a digitally modulated, complex, baseband version of a communication signal, referred to below as baseband communication signal 14.

Baseband communication signal source 12 may perform any number of activities well known to those skilled in the art of digital RF transmitters. For example, raw data to be transmitted from RF transmitter 10 may be digitally modulated using a suitable form of digital modulation, such as QPSK, CDMA, OFDM, or the like. The benefits of the present invention are best appreciated when the digital modulation generates a dynamic magnitude and phase that benefit from linear amplification downstream in an RF amplifier. In other words, the magnitude and phase values of the modulated symbols change on a sample-by-sample basis. Multiple data streams may have been digitally modulated and combined together for transmission, as occurs in a cellular base station. The digitally modulated signal may have been pulse-shaped to limit bandwidth while minimizing intersymbol interference (ISI). Additional processing may have been performed to reduce the peak-to-average power ratio. Any or all of these and other types of signal processing activities may be performed at baseband communication signal source 12. As a result of the processing performed at baseband communication signal source 12, baseband communication signal 14 is a digitally modulated, complex signal that exhibits a dynamic magnitude and phase and a bandwidth roughly equal to the bandwidth allocated to RF transmitter 10 for the transmission of RF energy. This bandwidth resides at baseband (i.e., near DC). Desirably, baseband communication signal 14 is an analytic signal having a bandwidth centered at or near 0 Hz.

In the embodiment of RF transmitter 10 depicted in FIG. 1, baseband communication signal 14 is supplied to inputs of a baseband signal processor 16, a baseband signal processor 18, an RF signal processor 20, and a variable delay element 22. FIG. 1 symbolizes the complex nature of baseband communication signal 14 and of other complex signals within RF transmitter 10 using a double-arrowhead notation. Baseband signal processor 16 generates an equalized baseband compensation signal 24 which is eventually fed to an output 26 of an RF amplifier 28 for combination with a bias signal. Baseband signal processor 18 generates an equalized baseband compensation signal 32 which is eventually fed to an input 30 of RF amplifier 28 for combination with a bias signal. Baseband signal processors 16 and 18 are discussed in more detail below in connection with FIG. 4.

RF signal processor 20 processes and converts baseband communication signal 14 into an RF communication signal 34, which is eventually combined with a bias signal to form a biased RF communication signal 34' supplied to RF amplifier 28. In particular, RF signal processor 20 implements a predistortion function that adds distortion to baseband communication signal 14, with the added distortion being configured to counteract the distortion applied in RF amplifier 28. As a result of the added distortion, the bandwidth of baseband communication signal 14 may expand beyond the bandwidth allocated to RF transmitter 10. Desirably, after the distortion has been counteracted through the operation of RF amplifier 28, the bandwidth of an amplified RF signal 36 output from RF amplifier 28 is, for the most part, reduced to the bandwidth allocated for RF transmitter 10. After predistortion, the baseband communication signal is converted into an analog baseband communication signal, an upconverter portion of RF signal processor 20 (not shown) upconverts the analog baseband communication signal, and a band-pass filter (not shown) removes unwanted spectral components.

RF communication signal 34 passes from RF signal processor 20 through an input matching network 38. At an output of input matching network 38, RF communication signal 34 is combined with a bias signal to form biased RF communication signal 34', which is fed to input 30 of RF amplifier 28. A driver amplifier stage (not shown) may also be included between RF signal processor 20 and input 30 of RF amplifier 28.

Amplified RF signal 36 passes from output 26 of RF amplifier 28, through an output matching network 40, to an antenna 42. But a directional coupler 44 is positioned upstream of antenna 42 to extract a portion of amplified RF signal 36 for use as a feedback signal 46. Those skilled in the art will appreciate that amplified RF signal 36 may pass through other components prior to antenna 42. For example, amplified RF signal 36 may also pass through a duplexer (not shown), and the duplexer may be located upstream or downstream of directional coupler 44. Conventional architectures known to those skilled in the art may be used for input and output matching networks 38 and 40.

RF amplifier 28 may be provided by any amplifying device or collection of devices known to those skilled in the art. FIG. 1 depicts RF amplifier 28 as being a field effect transistor (FET), and indeed, an LDMOS FET is one popular type of amplifying device that may be used as RF amplifier 28. But those skilled in the art will appreciate that other amplifying devices, including bipolar transistors, heterojunction transistors, electron tubes, other types of FETs, and the like may also serve as RF amplifier 28. And, "N" or "P" conductivity types may also characterize the amplifying device that serves as RF amplifier 28. Input 30 of RF amplifier 28 may be provided by a control terminal of the amplifying device, such as a gate of a FET or a base of a transistor. Output 26 of RF amplifier 28 may be provided by a conduction terminal of the amplifying device. The embodiment depicted in FIG. 1 shows a drain of a FET as the conduction terminal which serves as output 26 of RF amplifier 28. But a different type of amplifying device may use a source, or either a collector or emitter if the amplifying device is a bipolar transistor rather than a FET.

A bias controller 48 generates a bias signal 50 intended for input 30 of RF amplifier 28. Bias signal 50 is combined with equalized baseband compensation signal 32 at a combiner 52 so that a combined bias signal 54 substantially equals the sum of bias signal 50 and equalized baseband compensation signal 32. In one embodiment, combiner 52 may be provided, at least in part, by a coupling circuit that includes an operational amplifier. Combined bias signal 54 passes through an input bias feed network 56, where it is then combined with RF communication signal 34 to form biased RF communication signal 34', which is supplied to input 30 of RF amplifier 28.

A bias controller 58 generates a bias signal 60 intended for output 26 of RF amplifier 28. Bias signal 60 is combined with equalized baseband compensation signal 24 at a combiner 62 so that a combined bias signal 64 substantially equals the sum of bias signal 60 and equalized baseband compensation signal 24. Combiner 62 may be provided, at least in part, by a coupling circuit that includes a transformer. Combined bias signal 64 passes through an output bias feed network 66, where it is then supplied to output 26 of RF amplifier 28.

Bias controllers 48 and 58 may be implemented in a manner consistent with conventional bias control circuits known to those skilled in the art. In one embodiment, bias controllers 48 and 58 simply supply DC bias signals. But in RF transmitter applications where power added efficiency (PAE) is of greater concern, one or both of bias controllers 48 and 58 may generate one or more bias signals that roughly track the envelope of the modulating signal, baseband communication signal 14, as indicated by a dotted line coupling between baseband communication signal source 12 and bias controllers 48 and 58. When one or more of bias controllers 48 and 58 roughly track the modulating signal envelope, it is desirable that the bias controllers 48 and/or 58 implement a process which causes bias signals 50 or 60 to exhibit a bandwidth less than, and preferably less than one-half of, the bandwidth of baseband communication signal 14. As will be discussed in more detail below, the reduced bandwidth of bias signals 50 and 60 prevent the bandwidth of the vast majority of distortion caused by the bias signals from exceeding the allocated bandwidth for RF transmitter 10.

Likewise, bias feed networks 56 and 66 may be implemented in a manner consistent with conventional bias feed networks known to those skilled in the art. Desirably, bias feed networks 56 and 66 are each configured so that their impedance varies with frequency. Thus, bias feed networks 56 and 66 may exhibit relatively low impedance at baseband frequencies, relatively high impedance at the fundamental of the RF frequency, and relatively low impedance at a second harmonic of the RF frequency. Bias feed networks 56 and 66 may include quarter wavelength (for the RF signal) transmission lines (QWTL) and one or more capacitor terminators to accomplish these goals. But other architectures for bias feed networks 56 and 66 may also be used, and nothing requires bias feed networks 56 and 66 to exhibit a precisely flat response over the entirety of the baseband bandwidth or a near-zero impedance. In the preferred embodiment, bias feed networks 56 and 66 desirably present similar, and preferably identical, impedances to ground from the perspective of RF amplifier 28. And, in the preferred embodiment, the use of fewer capacitor terminators in feed networks 56 and 66 is more desirable.

Feedback signal 46 is supplied from directional coupler 44 to a first input of a feedback processor 68. And, after being delayed in variable delay element 22, baseband communication signal 14 is supplied to a second input of feedback processor 68.

Figure 2:
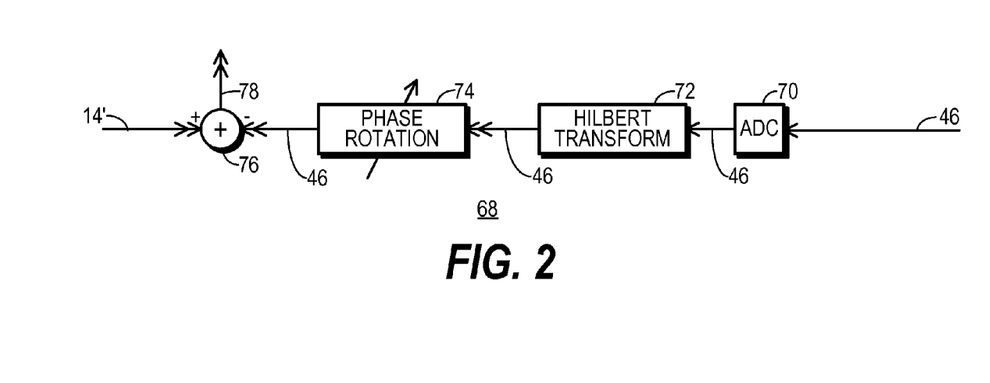
FIG. 2 shows a block diagram of a feedback processor portion the embodiment of the RF transmitter of FIG. 1.

FIG. 2 shows a block diagram of one embodiment of feedback processor 68. Referring to FIGS. 1 and 2, feedback signal 46 is supplied to an analog-to-digital converter (ADC) 70 of feedback processor 68, where feedback signal 46 is converted into a digital form. Then, the digital form of feedback signal 46 is supplied to a Hilbert transform circuit 72, where it is converted into a complex, analytic signal having in-phase and quadrature-phase components. ADC 70 and Hilbert transform circuit 72 perform a digital, subharmonic, sampling downconversion of feedback signal 46 into a baseband form of feedback signal 46. Thus, ADC 70 samples the RF form of feedback signal 46 in synchronism with mixing signals used in RF signal processor 20 to perform upconversion. The use of digital, subharmonic sampling for downconversion is desirable, but not a requirement, for the generation of a complex baseband signal because it reduces biases that result from the use of analog components in separate signal paths to perform a more conventional downconversion.

The baseband form of feedback signal 46 passes from Hilbert transform circuit 72 to a variable phase rotator 74. Variable delay element 22 is configured to delay baseband communication signal 14 into temporal alignment with the baseband form of feedback signal 46 at the output of variable phase rotator 74. A delayed version 14' of baseband communication signal 14 is combined in a combiner 76 with the baseband form of feedback signal 46 to form an error signal 78. Variable phase rotator 74 is adjusted to alter the phase of the baseband form of feedback signal 46 so that its phase substantially matches the phase of delayed baseband communication signal 14' at combiner 76. Desirably, variable phase rotator 74, and variable delay element 22 are each adjusted so that the correlation between delayed baseband communication signal 14' and the baseband form of feedback signal 46 is maximized. Error signal 78 represents the difference between the time-aligned and phase-aligned forms of baseband communication signal 14 and feedback signal 46.

Error signal 78 and delayed baseband communication signal 14' are provided to control inputs of RF signal processor 20. Error signal 78 is also provided to control inputs of baseband signal processors 16 and 18. In RF signal processor 20, the control inputs drive one or more adaptive equalizers (not shown). The adaptive equalizers predistort baseband communication signal 14 as discussed above. In particular, least-mean square (LMS) circuits of the adaptive equalizers determine correlation between the signals provided at the control inputs and drive, through integrators, finite impulse response (FIR) filter taps to values that minimize the correlation. Accordingly, baseband communication signal 14 is predistorted through the adaptive equalizers in such a way that correlation between error signal 78 and baseband communication signal 14 is minimized.

Figure 3:
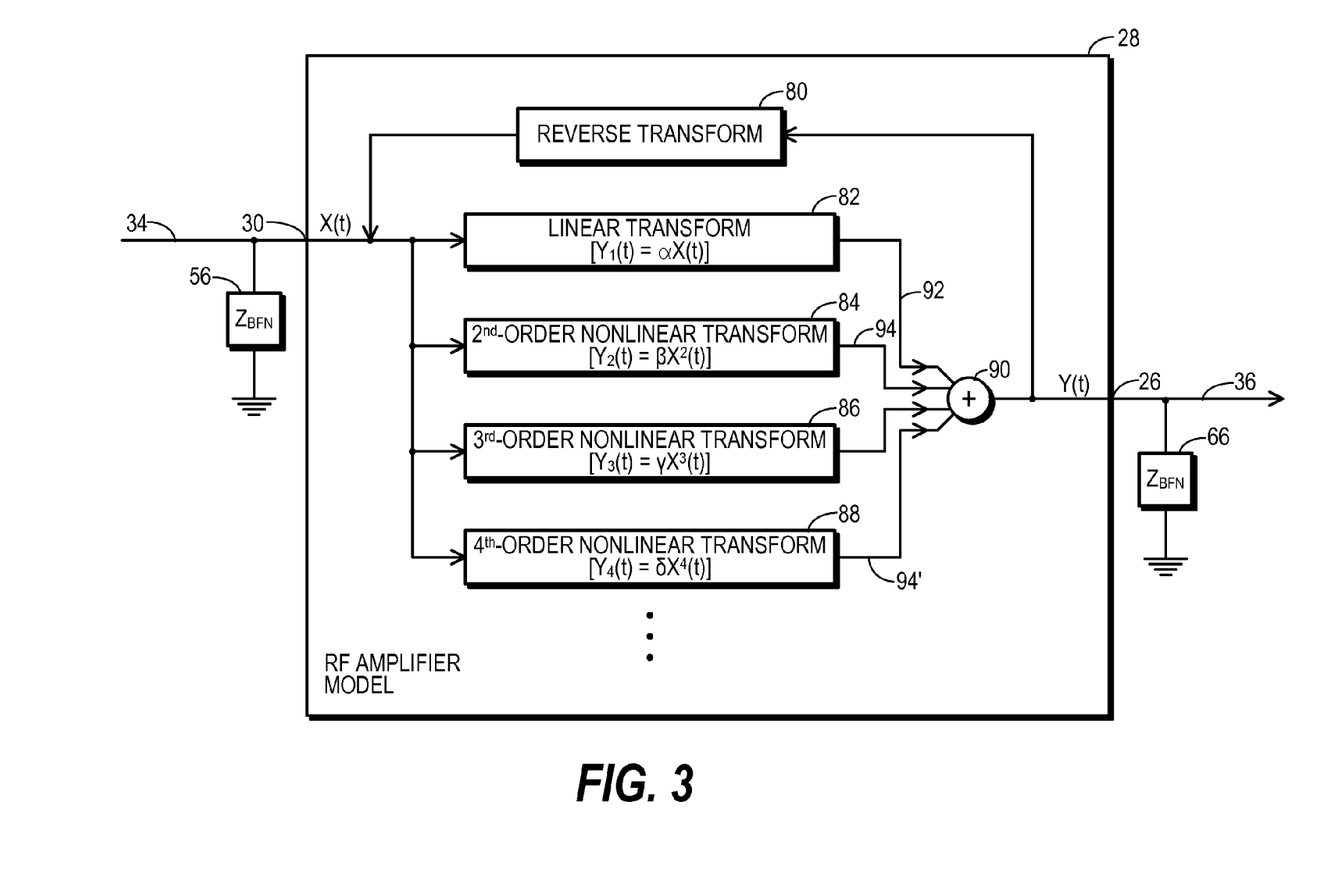
FIG. 3 shows a block diagram of a model which, at least in part, characterizes the performance of an RF amplifier portion of the RF transmitter of FIG. 1.

FIG. 3 shows a block diagram of a model which, at least in part, characterizes the performance of RF amplifier 28 for purposes of the present discussion. Those skilled in the art will appreciate that the model depicted in FIG. 3 provides a representation of how RF amplifier 28 appears to operate and does not represent any physical device. The model of FIG. 3 is provided for purposes of teaching the nature of signals that are relevant to distortion introduced through the operation of RF amplifier 28 and bias networks 56 and/or 66. Other models may be more suitable for other purposes.

Referring to FIGS. 1 and 3, RF communication signal 34 is applied across the impedance $Z_{BFN}$ presented by input bias feed network 56 to input 30. An input signal X(t) represents a combination of RF communication signal 34 and a signal output by a reverse transform block 80. The input signal X(t) is supplied to inputs of a linear transform bloc 82, a $2^{nd}$-order nonlinear transform block 84, a $3^{rd}$-order nonlinear transform block 86, a $4^{th}$-order nonlinear transform block 88, and so on. Outputs from transform blocks 82, 84, 86, 88 are combined in a combination block 90, and an output from combination block 90 supplies amplified RF signal 36 from output 26 of RF amplifier 28 across the impedance $Z_{BFN}$ presented by output bias feed network 66. In addition, amplified RF signal 36 is supplied to an input of reverse transform block 80.

FIG. 3 illustrates that amplified RF signal 36 is a combination of a variety of related signals or components. Desirably, the most dominant signal is a linear RF signal 92, referred to as $Y_1(t)$, where $Y_1(t)=\alpha X(t)$. Linear RF signal 92 is linearly related to X(t) and does not expand the bandwidth of X(t). Linear RF signal 92 represents the ideal signal desired at the output of RF amplifier 28. But spurious signals or signal components are also simultaneously generated and combined with linear RF signal 92 to form amplified RF signal 36. FIG. 3 illustrates that $Y_2(t)$, $Y_3(t)$, and $Y_4(t)$ respectively represent second order, third order, and fourth order functions of X(t). Desirably, $Y_2(t), Y_3(t)$, and $Y_4(t)$ are decreasingly less prominent than amplified RF signal 92. FIG. 3 also illustrates that these spurious signals are applied across the impedances presented by bias feed network 66, and through the operation of reverse transform 80, through bias feed network 56. Spurious signals need not be fed back to input 30 of RF amplifier 28 only through reverse transform 80 but may be fed back to input 30 through other channels outside RF amplifier 28.

The $Y_2(t), Y_3(t)$, and $Y_4(t)$ spurious signals are unwanted and referred to as distortion. While spurious signals at frequencies higher than the RF fundamental are unwanted, they can often be attenuated through the use of passive RF components conventionally used in matching networks, bias feed networks, transmission lines, and the like, as well as through the application of predistortion in RF signal processor 20. But spurious signals that fall near the fundamental RF signal are difficult to attenuate because techniques and processes aimed at such signals tend to affect the fundamental RF signal as well. The above-discussed predistortion of RF signal processor 20 (FIG. 1) is primarily aimed at reducing such spurious signals. But predistortion alone may not result in an adequate reduction in distortion.

Spurious signals at baseband frequencies also pose more of a problem. Thus, for example, spurious baseband signals 94 may develop a voltage across bias feed network 56 that combines with RF communication signal 34. Then, when the combined RF fundamental and spurious baseband signal is amplified in RF amplifier 28, the nonlinear transforms form unwanted intermodulation products in amplified RF signal 36. Simultaneously, spurious baseband signals 94 may develop a voltage across bias feed network 66 that adds spurious baseband signals 94 to the output bias voltage ($V_{ds}$ for the FET version of RF amplifier depicted in FIG. 1). This also results in an intermodulation product in amplified RF signal 36 of the desired signal and spurious baseband signals 94.

In other words, each of the two different input and output bias feed networks 56 and 66 may cause its own unwanted intermodulation product. But when the impedances to ground of each of bias feed networks 56 and 66 are similar, the resulting voltages which result from spurious baseband signals 94 acting upon the impedances of bias feed networks 56 and 66 are spectrally similar, and a solution for intermodulation product caused by input bias feed network 56 tends to solve the unwanted intermodulation product caused by output bias feed network 66, and vice-versa.

The intermodulation products formed by even-ordered nonlinear transforms, and particular by $2^{nd}$-order nonlinear transform 84, are unwanted. These intermodulation products are a form of RF distortion that reside near the fundamental RF frequency, and are likely to be outside the allocated bandwidth for RF transmitter 10. It is this RF distortion that is desirably minimized in RF transmitter 10.

More particularly, a spurious baseband signal 94 may be generated through the operation of $2^{nd}$-order nonlinear transform 84. Assume, $$X(t) \equiv A(t)\cos[\omega_c(t) + \Theta(t)]. \qquad \text{EQ. 1}$$

EQ. 1 ignores the contribution of reverse transform 80 and simply characterizes a modulated fundamental RF waveform. X(t) may be written in terms of its complex envelope, $\tilde{z}$, as:

$$X(t) \equiv \left(\frac{1}{2}\right)\tilde{z}(t)e^{j\omega_c t} + \left(\frac{1}{2}\right)\tilde{z}^*(t)e^{-j\omega_c t}, \qquad \text{EQ. 2}$$

where, $$\tilde{z}(t) \equiv A(t)e^{j\Theta(t)}. \qquad \text{EQ. 3}$$

Then, for $2^{nd}$-order nonlinearity transform 84, $$Y_2(t) \equiv \beta X^2(t) = \beta\left[\left(\frac{1}{2}\right)\tilde{z}(t)e^{j\omega_c t} + \left(\frac{1}{2}\right)\tilde{z}^*(t)e^{-j\omega_c t}\right]^2. \qquad \text{EQ. 4}$$

By expanding the squared term from EQ. 4, $$Y_2(t) = \frac{\beta}{4}[(\tilde{z}(t))^2 e^{j2\omega_c t} + (\tilde{z}^*(t))^2 e^{-j2\omega_c t} + 2\tilde{z}(t)\tilde{z}^*(t)]. \qquad \text{EQ. 5}$$

Since $$|\tilde{z}(t)|^2 = \tilde{z}(t)\tilde{z}^*(t), \qquad \text{EQ. 6}$$

$2^{nd}$-order nonlinear transform 84 generates a spurious second-harmonic signal having a frequency at the second harmonic of the RF fundamental, and at twice the bandwidth of baseband communication signal 14, and a spurious baseband signal 94 roughly equal to the magnitude-squared of the complex envelope, but at roughly twice the bandwidth of baseband communication signal 14. Those skilled in the art will appreciate that $4^{th}$-order nonlinear transform 88 will also generate a spurious baseband signal 94' along with second and $4^{th}$-order harmonic terms. Other even-ordered transforms will produce other spurious baseband signals. Spurious baseband signal 94' will exhibit a lower magnitude than spurious baseband signal 94 and four times the bandwidth of baseband communication signal 14. Odd-ordered nonlinear transforms do not to produce significant amounts of spurious baseband signals.

When spurious baseband signals 94 are combined with the RF fundamental through the operation of reverse transform 80, $Y_2(t)$ additionally includes terms that are the cross products of the spurious baseband signals 94 and RF communication signal 34. These cross-product terms represent RF distortion that resides near the bandwidth allocated for RF transmitter 10. These cross-product terms are sensed by feedback signal 46, along with the desired linear RF signal 92 and other intermodulation terms from odd-ordered transforms, and then routed back to feedback processor 78.

Since spurious baseband signals 94 exhibit at least twice the bandwidth of baseband communication signal 14, and since the above-discussed bias signals 50 and 60 desirably exhibit a bandwidth less than the bandwidth of baseband communication signal 14, and more preferably less than one-half of the bandwidth of baseband communication signal 14, bias signals 50 and 60 desirably exhibit a bandwidth less than one-half of the bandwidth of spurious baseband signals 94, and more preferably less than one-fourth of the bandwidth of spurious baseband signals 94.

Referring back to FIG. 1, baseband signal processors 16 and 18 generate and configure equalized baseband compensation signals 24 and 32 to compensate for spurious baseband signals 94. In particular, equalized baseband compensation signals 24 and 32 desirably cancel spurious baseband signals 94 by a sufficient amount so that the resulting RF distortion is reduced to the point where RF transmitter 10 refrains from producing substantial amounts of RF energy outside its allocated bandwidth.

Figure 4:
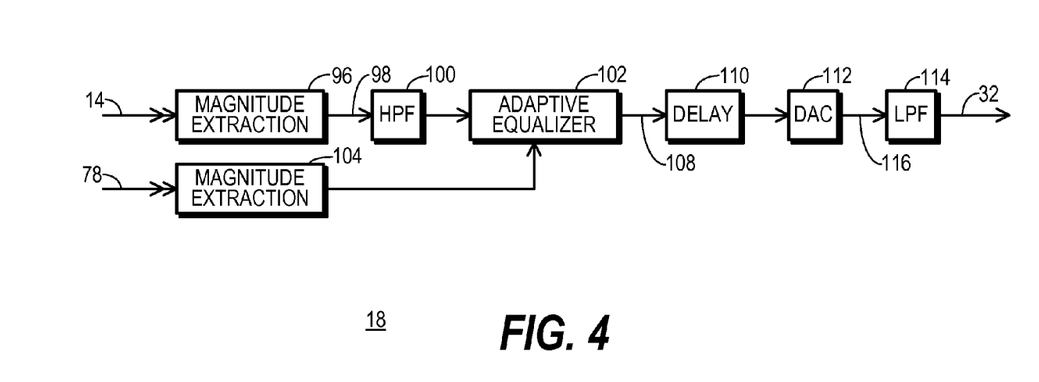
FIG. 4 shows a block diagram of a baseband signal processor portion of the embodiment of the RF transmitter of FIG. 1.

FIG. 4 shows a block diagram of baseband signal processor 18. Baseband signal processor 16 may be configured similarly. Consequently, the following discussion of baseband signal processor 18 applies to baseband signal processor 16 as well.

Referring to FIGS. 1 and 4, baseband signal processor 18 includes a magnitude extraction circuit 96 to which a baseband communication signal, such as baseband communication signal 14 is fed. The baseband communication signal supplied to magnitude extraction circuit 96 corresponds to RF communication signal 34. In the embodiment shown in the figures, RF communication signal 34 is generated from baseband communication signal 14, and baseband communication signal 14 drives magnitude extraction circuit 96. But in other embodiments a baseband communication signal obtained from RF signal processor 20, perhaps downstream of predistortion, may be used, or a baseband communication signal may be obtained by downconversion from RF communication signal 34. Any of a variety of different baseband communication signals that correspond to RF communication signal 34 through frequency shifting and/or baseband signal processing activities is contemplated for application to magnitude extraction circuit 96.

Magnitude extraction circuit 96 generates a baseband compensation signal 98 in response to the baseband communication signal supplied at its input. As discussed above, baseband communication signal 14 is a digital, complex signal of dynamic magnitude and phase which exhibits a bandwidth substantially equal to the bandwidth allocated for RF transmitter 10. Baseband compensation signal 98 is responsive to the dynamic magnitude of baseband communication signal 14 but unresponsive to the phase of baseband communication signal 14, and is more preferably responsive to the magnitude-squared to better cancel spurious baseband signal 94 as identified by EQs. 5 and 6 presented above. Thus, if baseband communication signal 14 is presented to magnitude extraction circuit 96 in rectilinear form, magnitude extraction circuit 96 may perform the operation ($I^2+Q^2$), where I and Q represent in-phase and quadrature-phase components of the complex baseband communication signal. If baseband communication signal 14 is presented to magnitude extraction circuit 96 in polar form, magnitude extraction circuit 96 may simply discard phase information, and take the square of magnitude information. While magnitude-squared is a desired form of baseband compensation signal 98, the magnitude (i.e., not squared) will also provide acceptable results for some applications.

Magnitude extraction circuit 96 doubles the bandwidth of baseband compensation signal 98, substantially matching the bandwidth of spurious baseband signal 94. Although not shown, appropriate rate-increasing circuits may be included in magnitude extraction circuit 96 to accommodate the increased bandwidth. In an alternate embodiment, magnitude extraction circuit 96 may generate or also generate baseband compensation signal 98 to be related to the baseband signal raised to the fourth power, with the corresponding further increase in bandwidth and sample rate.

Baseband compensation signal 98 passes through a high-pass filter (HPF) 100 to an input of an adaptive equalizer 102. In particular, in one embodiment baseband compensation signal 98 drives a signal input of a FIR filter portion of adaptive equalizer 102. But a parametric filter structure may be used as well. High-pass filter 100 is configured to block DC components. In addition, high-pass filter 100 may also be configured to attenuate low-frequency components of baseband compensation signal 98 to isolate a feedback loop which causes equalized baseband compensation signal 32 to track spurious baseband signal 94 from the lower frequency bias signal 50 (FIG. 1).

Error signal 78 is supplied to a control input of adaptive equalizer 102. In particular, error signal 78 is fed through a magnitude extraction circuit 104. Magnitude extraction circuit 104 performs substantially the same operation as magnitude extraction circuit 96. An output of magnitude extraction circuit 104 couples to a tap-adjustment input of adaptive equalizer 102.

In the preferred embodiment, adaptive equalizer 102 is configured to implement a dithered linear search (DLS) algorithm to cause adaptive equalizer 102 to adapt its taps or parameters. As known to those skilled in the art, the DLS algorithm obtains gradient estimates by applying independent additive dither to all of the filters taps simultaneously and correlating the resulting changes in the output squared error to the dither signals. But those skilled in the art may also use other adaptation algorithms in adaptive equalizer 102. Accordingly, baseband compensation signal 98 is spectrally and temporally adjusted through adaptive equalizer 102 to minimize the power of error signal 78. This occurs when equalized baseband compensation signal 32 substantially cancels spurious baseband signal 94 at input 30 of RF amplifier 28.

Adaptation in adaptive equalizer 102 stabilizes when adaptive equalizer 102 has synthesized a filter that mimics the impedance of bias feed networks 56 and/or 66. The use of bias feed networks 56 and 66 that are simpler and in which impedance exhibits less change over frequency is desirable because such architectures allow adaptive equalizer 102 to be less complex as well.

Adaptive equalizer 102 generates a digital equalized baseband compensation signal 108. Signal 108 passes through a delay element 110 and a digital-to-analog converter (DAC) 112 to a low-pass filter 114. Low-pass filter 114 generates equalized baseband compensation signal 32, which is fed to input 30 of RF amplifier 28 through combining circuit 52 and input bias feed network 56. Low-pass filter 114 is configured to remove switching transients from and/or other high frequency components outside the bandwidth of interest. Digital-to-analog converter 112 converts digital equalized baseband compensation signal 108 into an analog equalized baseband compensation signal 116, in a manner understood by those skilled in the art. Delay element 110 temporally aligns equalized baseband compensation 32 with RF communication signal 34 at input 30 of RF amplifier 28.

Accordingly, equalization is applied in baseband signal processor 18 by adaptive equalizer 102 to baseband compensation signal 98 to minimize RF distortion in amplified RF signal 36 caused by spurious baseband signal 94.

As discussed above, baseband signal processor 16 is configured similarly to baseband signal processor 18. Accordingly, equalization is also applied in baseband signal processor 16 by a similar adaptive equalizer to a similar baseband compensation signal to further minimize RF distortion in amplified RF signal 36 caused by spurious baseband signal 94.

In one alternate embodiment of RF transmitter 10, combining circuit 52 may be moved within baseband signal processor 18, and/or combining circuit 62 may be moved within baseband signal processor 16. In this alternate embodiment, bias signal 50 and/or bias signal 60 may be generated digitally and digitally combined with baseband compensation signal 108 prior to analog conversion in digital-to-analog converter 112.

In another alternate embodiment of RF transmitter 10, only one of baseband signal processors 16 and 18 is included in RF transmitter 10. Preferably, that one is baseband signal processor 18, which drives input 30 of RF amplifier 28.

Figure 5:
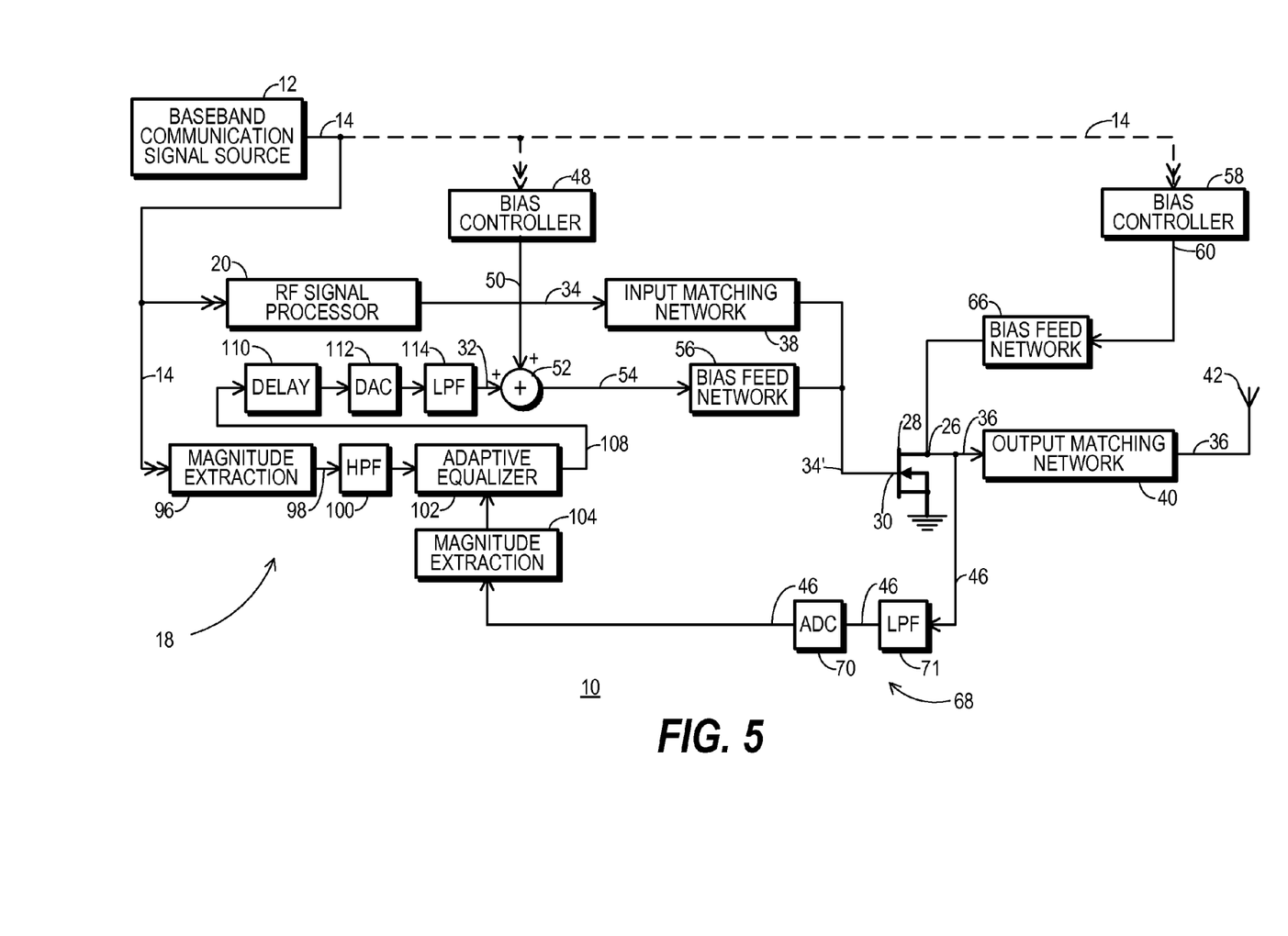
FIG. 5 shows a block diagram of the RF transmitter configured in accordance with the teaching of a second embodiment of the present invention.

FIG. 5 shows a block diagram of RF transmitter 10 configured in accordance with the teaching of another embodiment of the present invention. In the embodiments of FIGS. 1-4, the equalizing activity of adaptive equalizer 102 responds to an RF signal component of amplified RF signal 36 generated by RF amplifier 28. The embodiment of FIG. 5 differs from the embodiment of FIGS. 1-4 in that adaptive equalizer 102 responds to a baseband signal component of biased RF communication signal 34'. In addition, the FIG. 5 embodiment omits baseband signal processor 16, and no equalized baseband compensation signal 24 is applied to output 26 of RF amplifier 28.

As discussed above in connection with FIG. 3, amplified RF signal 36 is a combination of a variety of related signals or components. Two of these related signals are spurious baseband signal 94 and spurious baseband signal 94', generated by $2^{nd}$-order and $4^{th}$ order nonlinear transform blocks 84 and 88. Spurious baseband signals 94 act upon input bias feed network 56 and output bias feed network 66 to generate unwanted intermodulation products at and near the fundamental RF frequency. These RF intermodulation products drive adaptive equalizer 102 in the embodiment of FIGS. 1-4. The RF intermodulation products pass through output matching network 40 and directional coupler 44, where they is presented in feedback signal 46.

But spurious baseband signals 94 do not effectively pass through output matching network 40 and directional coupler 44. In order to make adaptive equalizer 102 directly responsive to baseband signals 94, the FIG. 5 embodiment of RF transmitter 10 senses, through an appropriate voltage sensor, amplified RF signal 36 at output 26 of RF amplifier 26 to form feedback signal 46. Feedback signal 46 then passes through a low-pass filter (LPF) 71. In an alternate embodiment (not shown), the signal at input 30 of RF amplifier 26 is sensed to form feedback signal 46.

Low-pass filter 71 is configured to block signals significantly above baseband, including signals and signal components at or near the fundamental RF frequency band. After low-pass filter 71, feedback signal 46, now filtered to present baseband signals, drives analog-to-digital converter (ADC) 70 to form a digitized form of feedback signal 46, and this digitized form of feedback signal 46 is then supplied to the control input of baseband signal processor 18 at magnitude extraction circuit 104, as discussed above in connection with FIGS. 1-4.

In this embodiment, a magnitude-squared baseband communication signal is combined with a gate bias signal and spectrally configured to cancel the distortion caused by spurious baseband signals 94. A feedback loop causes adaptive equalizer 102 to adapt to minimize this distortion. In particular, adaptive equalizer 102 adapts to keep the power of the baseband portion of feedback signal 46 at a minimum. By keeping the baseband portion of feedback signal 46 at a minimum, the form of RF distortion responsive to spurious baseband signals 94 is likewise minimized.

In summary, the present invention provides an improved distortion-compensated RF amplifier and method therefor. In at least one embodiment of the present invention, spurious baseband signals are compensated to minimize RF distortion. In at least one embodiment of the present invention equalization is applied to a baseband compensation signal fed to an RF amplifier to minimize RF distortion in an amplified RF signal. In at least one embodiment of the present invention, a feedback signal is developed from an RF amplifier and used to control a baseband compensation signal fed to the RF amplifier to reduce a spurious baseband signal generated by the RF amplifier.

Although the preferred embodiments of the invention have been illustrated and described in detail, it will be readily apparent to those skilled in the art that various modifications may be made therein without departing from the spirit of the invention or from the scope of the appended claims. These and other modifications and adaptations which are obvious to those skilled in the art are to be included within the scope of the present invention.

What is claimed is:

1. A distortion-compensated radio-frequency (RF) transmitter comprising:
    an RF amplifier that generates an amplified RF signal which includes a spurious baseband signal, said amplified RF signal being generated in response to an RF communication signal supplied to an input of said RF amplifier;
    a signal processor having an output coupled to said input of said RF amplifier, said signal processor being configured to digitally generate a baseband compensation signal corresponding to said RF communication signal, to apply equalization to said baseband compensation signal to produce an equalized baseband compensation signal, and to convert said equalized baseband compensation signal into an analog equalized baseband compensation signal which is applied at baseband to said input of said RF amplifier; and
    a feedback processor having an input coupled to said RF amplifier and having an output coupled to said signal processor;
    wherein said signal processor is further configured so that said equalization applied to said baseband compensation signal adapts to minimize RF distortion in said amplified RF signal caused by said spurious baseband signal.

2. An RF transmitter as claimed in claim 1 wherein said input of said feedback processor is coupled to an output of said RF amplifier.

3. An RF transmitter as claimed in claim 1 wherein:
    said RF transmitter additionally comprises a baseband communication signal source configured to supply a complex baseband communication signal exhibiting a dynamic magnitude and phase to said signal processor; and
    said signal processor is configured so that said baseband compensation signal is responsive to said dynamic magnitude of said complex baseband communication signal and is unresponsive to said dynamic phase of said complex baseband communication signal.

4. An RF transmitter as claimed in claim 3 wherein said baseband compensation signal is responsive to a magnitude-squared baseband communication signal.

5. An RF transmitter as claimed in claim 1 wherein:
    said RF transmitter additionally comprises a baseband communication signal source configured to supply a baseband communication signal; and
    said RF transmitter additionally comprises a bias controller configured to supply a bias signal to said input of said RF amplifier, said bias controller being configured so that said bias signal tracks an envelope of said baseband communication signal.

6. An RF transmitter as claimed in claim 5 wherein:
    said spurious baseband signal exhibits a first bandwidth; and said bias signal exhibits a second bandwidth less than one-half said first bandwidth.

7. An RF transmitter as claimed in claim 1 wherein said RF transmitter additionally comprises a baseband communication signal source configured to supply a complex, digital baseband communication signal to said baseband signal processor, and said baseband signal processor comprises:
- a magnitude extraction circuit adapted to receive said baseband communication signal and to generate a magnitude signal;
- a digital equalizer adapted to receive said magnitude signal and to generate said equalized baseband compensation signal in response to said magnitude signal; and
- a digital-to-analog converter adapted to receive said equalized baseband compensation signal and to generate said analog equalized baseband compensation signal in response to said equalized baseband compensation signal, said digital-to-analog converter being coupled to said input of said RF amplifier.

8. An RF transmitter as claimed in claim 1 wherein said feedback processor is configured to sense an RF signal component at an output of said RF amplifier.

9. An RF transmitter as claimed in claim 1 wherein said feedback processor is configured to sense a baseband signal component at an output of said RF amplifier.

10. An RF transmitter as claimed in claim 9 wherein said feedback processor comprises:
- a low pass filter configured to block RF signals, said low pass filter having an input coupled to an output of said RF amplifier and having an output; and
- an analog-to-digital converter having an input coupled to said output of said low pass filter and being configured to digitize said baseband signal component.

11. An RF transmitter as claimed in claim 9 additionally comprising:
- a bias feed network having an output coupled to said output of said RF amplifier; and
- an output matching network having an input coupled to said output of said RF amplifier;
- wherein said feedback processor couples to said output of said bias feed network, to said input of said output matching network, and to said output of said RF amplifier.

12. An RF transmitter as claimed in claim 9 wherein said signal processor is further configured so that said equalization applied to said baseband compensation signal adapts to minimize power of said spurious baseband signal.

13. An RF transmitter as claimed in claim 1 additionally comprising:
- a baseband communication signal source configured to supply a baseband communication signal to said signal processor; and
- an RF signal processor adapted to receive said baseband communication signal and configured to generate said RF communication signal supplied to said input of said RF amplifier.

14. An RF transmitter as claimed in claim 13 wherein said RF signal processor is configured to implement a predistortion function that adds distortion to said baseband communication signal.

15. A method of compensating for distortion in a radio-frequency (RF) transmitter comprising:
- supplying an RF communication signal to an input of said RF amplifier;
- generating an amplified RF signal which includes a spurious baseband signal at said RF amplifier, said amplified RF signal being generated in response to said RF communication signal;
- digitally generating a baseband compensation signal corresponding to said RF communication signal;
- equalizing said baseband compensation signal to produce an equalized baseband compensation signal;
- converting said equalized baseband compensation signal into an analog equalized baseband compensation signal;
- feeding said analog equalized baseband compensation signal at baseband to said input of said RF amplifier to compensate for said spurious baseband signal; and
- adapting said equalizing activity to minimize RF distortion in said amplified RF signal caused by said spurious baseband signal.

16. A method as claimed in claim 15 wherein said adapting activity causes said equalizing activity to adapt in response to a baseband signal component from said RF amplifier.

17. A method as claimed in claim 15 wherein said RF communication signal is formed from a baseband communication signal and said baseband compensation signal is formed from said baseband communication signal.

18. A method as claimed in claim 15 wherein said RF communication signal exhibits distortion added by a predistortion function.

* * * * *